United States Patent
Takayama et al.

(10) Patent No.: US 10,867,777 B2
(45) Date of Patent: Dec. 15, 2020

(54) PLASMA PROCESSING METHOD AND PLASMA PROCESSING APPARATUS

(71) Applicant: Tokyo Electron Limited, Tokyo (JP)

(72) Inventors: Wataru Takayama, Miyagi (JP); Muneyuki Omi, Miyagi (JP); Rei Ibuka, Miyagi (JP); Dai Igarashi, Miyagi (JP); Takayuki Suzuki, Miyagi (JP); Takahiro Murakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/293,725

(22) Filed: Mar. 6, 2019

(65) Prior Publication Data

US 2019/0279850 A1 Sep. 12, 2019

(30) Foreign Application Priority Data

Mar. 7, 2018 (JP) ................. 2018-040296

(51) Int. Cl.
| | |
|---|---|
| *H01J 37/32* | (2006.01) |
| *H01L 21/67* | (2006.01) |
| *B08B 7/00* | (2006.01) |
| *H01L 21/687* | (2006.01) |
| *H01L 21/683* | (2006.01) |
| *H01L 21/311* | (2006.01) |
| *H01L 21/8234* | (2006.01) |

(52) U.S. Cl.
CPC ...... *H01J 37/32862* (2013.01); *B08B 7/0035* (2013.01); *H01J 37/3244* (2013.01); *H01J 37/32724* (2013.01); *H01L 21/31116* (2013.01); *H01L 21/67069* (2013.01); *H01L 21/67109* (2013.01); *H01L 21/67248* (2013.01); *H01L 21/67253* (2013.01); *H01L 21/6831* (2013.01); *H01L 21/68714* (2013.01); *H01L 21/823468* (2013.01)

(58) Field of Classification Search
CPC ......... H01L 21/67248; H01L 21/67069; H01L 21/67109; H01L 21/68714; H01J 37/32724; H01J 37/32862; B08B 7/0035
USPC ..................................... 216/67, 71
See application file for complete search history.

(56) References Cited

U.S. PATENT DOCUMENTS

| | | | |
|---|---|---|---|
| 2017/0062227 A1* | 3/2017 | Ishikawa | H01L 21/3065 |
| 2018/0211822 A1* | 7/2018 | Gohira | H01J 37/3244 |
| 2018/0211824 A1* | 7/2018 | Kudo | H01J 37/32642 |

FOREIGN PATENT DOCUMENTS

JP 07-078802 A 3/1995

* cited by examiner

*Primary Examiner* — Binh X Tran
(74) *Attorney, Agent, or Firm* — Abelman, Frayne & Schwab (57) ABSTRACT

A plasma processing method includes: plasma-processing a substrate placed on a surface of a placement table while causing a coolant of 0° C. or lower to flow through a coolant flow path formed inside the table; placing a dummy substrate on the surface of the placement table in place of the substrate; and removing a reaction product generated due to the plasma processing of the substrate by the plasma of the processing gas from a peripheral edge portion of the surface of the placement table while heating the surface of placement table by the plasma of the processing gas via the dummy substrate in a state where the dummy substrate is placed on the surface of the placement table.

20 Claims, 10 Drawing Sheets

PLASMA PROCESSING METHOD AND PLASMA PROCESSING APPARATUS

CROSS-REFERENCE TO RELATED APPLICATIONS

This application is based on and claims priority from Japanese Patent Application No. 2018-040296, filed on Mar. 7, 2018, with the Japan Patent Office, the disclosures of which are incorporated herein in their entireties by reference.

TECHNICAL FIELD

Various aspects and embodiments of the present disclosure relate to a plasma processing method and a plasma processing apparatus.

BACKGROUND

In the related art, a substrate such as a semiconductor wafer placed on a placement table is plasma-processed using a plasma processing apparatus. A plasma etching is an example of plasma processing. The reaction products generated due to the etching of a substrate may adhere to the peripheral edge portion of the substrate or the peripheral edge portion of a placement surface in some cases. The reaction products adhering to the peripheral edge portion of the placement surface may be a factor that hinders attraction between the placement surface and the substrate.

Here, as a method of removing the reaction products adhering to a member provided inside a processing container, there is a method of removing the reaction products, for example, in a state where no substrate is placed on the placement surface of a placement table. As the processing gas, for example, an oxygen-containing gas is used. See, for example, Japanese Patent Laid-open Publication No. 07-078802.

SUMMARY

In an embodiment, a plasma processing method disclosed herein includes: plasma-processing a substrate placed on a surface of a placement table while causing a coolant of 0° C. or lower to flow through a coolant flow path formed inside the placement table; placing a dummy substrate on the surface of the placement table in place of the substrate; and removing a reaction product generated due to the plasma processing of the substrate by the plasma of the processing gas from a peripheral edge portion of the surface of the placement table while heating the surface of the placement table by the plasma of the processing gas via the dummy substrate in a state where the dummy substrate is placed on the surface of the placement table.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described in detail with reference to the drawings. In each drawing, the same or corresponding components will be denoted by the same symbols.

Configuration of Plasma Etching Apparatus According to Embodiment

Figure 1:
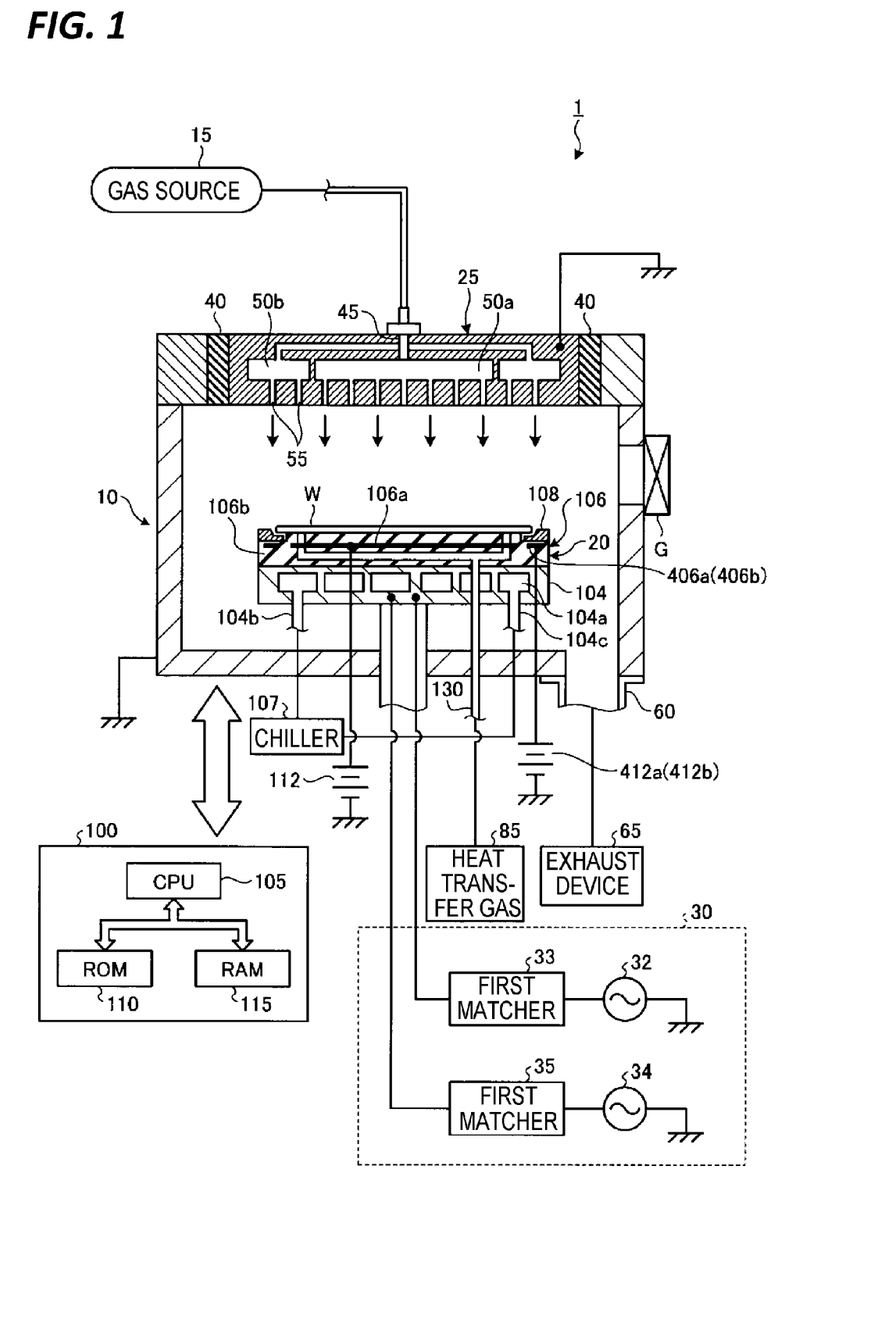
FIG. 1 is a view illustrating an example of a vertical cross section of a plasma etching apparatus 1 according to an embodiment.

First, a plasma etching apparatus 1 according to an embodiment will be described with reference to FIG. 1. FIG. 1 is a view illustrating an example of a vertical cross section of a plasma etching apparatus 1 according to an embodiment. The plasma etching apparatus 1 according to the present embodiment is an example of a plasma processing apparatus that plasma-processes a substrate. In the plasma etching apparatus 1 according to the present embodiment, a semiconductor wafer is plasma-etched, but not limited to this. A desired plasma processing such as film formation or sputtering is performed by the plasma processing apparatus. The plasma etching apparatus 1 according to the present embodiment is a parallel flat plate type plasma processing apparatus (capacitively coupled plasma processing apparatus) in which a placement table 20 and a gas shower head 25 are disposed opposite each other inside a chamber 10. The placement table 20 also functions as a lower electrode, and the gas shower head 25 also functions as an upper electrode.

The plasma etching apparatus 1 has a cylindrical chamber 10 made of, for example, aluminum of which the surface is subjected to an alumite treatment (anodized). The chamber 10 is electrically grounded. A placement table 20 configured to place a semiconductor wafer (hereinafter simply referred to as a "wafer W") thereon is provided on the bottom of the chamber 10. The wafer W is an example of a substrate. The placement table 20 includes an electrostatic chuck 106 configured to hold a wafer W by an electrostatic attraction force and a base 104 configured to support the electrostatic chuck 106.

The base 104 is made of, for example, aluminum (Al), titanium (Ti), or silicon carbide (SiC).

On the upper surface of the base 104, an electrostatic chuck 106 is installed in order to electrostatically attract a wafer. The electrostatic chuck 106 has a structure in which a chuck electrode 106a is sandwiched between insulators 106b. A direct current (DC) voltage source 112 is connected to the chuck electrode 106a, and a DC voltage HV is applied from the DC voltage source 112 to the chuck electrode 106a, whereby the wafer W is attracted to the electrostatic chuck 106 by a Coulomb force. On the upper surface of the electrostatic chuck 106, a holding surface configured to hold the wafer W thereon and a peripheral edge portion which is lower than the holding surface are formed. The wafer W is placed on the holding surface of the electrostatic chuck 106. In the following description, the holding surface of the electrostatic chuck 106 will be appropriately referred to as a "placement surface of the placement table 20."

A focus ring 108 is disposed around the peripheral edge portion of the electrostatic chuck 106 so as to surround the wafer W placed on the placement surface of the placement table 20. The focus ring 108 is made of, for example, silicon or quartz. The focus ring 108 functions to enhance in-plane uniformity of etching.

Further, inside the electrostatic chuck 106 below the focus ring 108, chuck electrodes 406a and 406b are provided. A DC voltage source 412a is connected to the chuck electrode 406a, and a DC voltage HV-A is applied from the DC voltage source 412a to the chuck electrode 406a. Similarly, a DC voltage source 412b is connected to the chuck electrode 406b, and a DC voltage HV-B is applied from the DC voltage source 412b to the chuck electrode 406b. As a result, the electrostatic chuck 106 and the focus ring 108 are electrostatically attracted by a Coulomb force.

In addition, inside the placement table 20 (the base 104), a coolant flow path 104a is formed. A coolant inlet pipe 104b and a coolant outlet pipe 104c are connected to the coolant flow path 104a. A cooling medium (hereinafter, also referred to as "coolant") such as, for example, cooling water or brine output from a chiller 107 circulates through the coolant inlet pipe 104b, the coolant flow path 104a, and the coolant outlet pipe 104c. The placement table 20 and the electrostatic chuck 106 are heat-released and cooled by the coolant.

The heat transfer gas supply source 85 supplies a heat transfer gas such as, for example, helium gas (He) or argon gas (Ar) through the gas supply line 130 to the rear surface of the wafer W on the electrostatic chuck 106. With such a configuration, the temperature of the electrostatic chuck 106 is controlled by the coolant circulated in the coolant flow path 104a and the heat transfer gas supplied to the rear surface of the wafer W. As a result, the wafer W may be controlled to a predetermined temperature. The heat transfer gas supply source 85 and the gas supply line 130 are examples of heat transfer gas supply mechanism that supply a heat transfer gas to the rear surface of the wafer W.

To the placement table 20, a power supply device 30 configured to supply dual-frequency superimposed power is connected. The power supply device 30 may include a first radio-frequency power supply 32 configured to supply first radio-frequency power of a first frequency (radio-frequency power for plasma generation), a second radio-frequency power supply 34 configured to supply second radio-frequency power of a second frequency lower than the first frequency (radio-frequency power for bias voltage generation). The first radio frequency power supply 32 is electrically connected to the placement table 20 via a first matcher 33. The second radio-frequency power supply 34 is electrically connected to the placement table 20 via a second matcher 35. The first radio-frequency power supply 32 applies, for example, first radio-frequency power of 40 MHz to the placement table 20. The second radio-frequency power supply 34 applies, for example, second radio-frequency power of 400 kHz to the placement table 20. In the present embodiment, the first radio-frequency power is applied to the placement table 20, but it may be applied to the gas shower head 25.

The first matcher 33 matches a load impedance to the internal (or output) impedance of the first radio-frequency power supply 32. The second matcher 35 matches a load impedance to the internal (or output) impedance of the second radio-frequency power supply 34. The first matcher 33 functions such that the internal impedance of the first radio-frequency power supply 32 apparently coincides with the load impedance when plasma is generated in the chamber 10. The second matcher 35 functions such that the internal impedance of the second radio-frequency power supply 34 apparently coincides with the load impedance when plasma is generated in the chamber 10.

The gas shower head 25 is attached so as to close the opening of the ceiling portion of the chamber 10 via a shield ring 40 that covers the peripheral edge portion of the gas shower head 25. The gas shower head 25 may be electrically grounded as illustrated in FIG. 1. In addition, a variable DC power supply may be connected to apply a predetermined DC voltage to the gas shower head 25.

A gas introduction port 45 for introducing a gas is formed in the gas shower head 25. Inside the gas shower head 25, a center diffusion chamber 50a and an edge diffusion chamber 50b are branched from the gas introduction port 45. The gas output from the gas source 15 is supplied to the diffusion chambers 50a and 50b via the gas introduction port 45, diffused in the diffusion chambers 50a and 50b, and introduced from a large number of gas supply holes 55 toward the placement table 20.

An exhaust port 60 is formed in the bottom of the chamber 10, and the inside of the chamber 10 is evacuated by an exhaust device 65 connected to the exhaust port 60. As a result, it is possible to maintain the inside of the chamber 10 at a predetermined degree of vacuum. On the side wall of the chamber 10, a gate valve G is provided. The gate valve G opens/closes a loading/unloading port when loading/unloading of a wafer W to/from the chamber 10 is performed.

The plasma etching apparatus 1 is provided with a controller 100 configured to control the operation of the entire apparatus. The controller 100 includes a central processing unit (CPU) 105, a read only memory (ROM) 110, and a random access memory (RAM) 115. According to various recipes stored in these storage areas, the CPU 105 executes a desired processing such as, for example, a plasma processing to be described later. The recipes include, for example, process time, pressure (gas evacuation), radio-frequency power and voltage, various gas flow rates, temperature in the chamber (upper electrode temperature, side wall temperature of the chamber, or wafer W temperature (electrostatic chuck temperature)), and the temperature of coolant output from the chiller 107. In addition, recipes representing these programs and processing conditions may be stored in a hard disk or a semiconductor memory. Further, the recipes may be set in or read from a predetermined position in the state of being stored in a storage medium readable by a portable computer such as, for example, a CD-ROM and a DVD.

For example, the controller 100 controls each unit of the plasma etching apparatus 1 so as to perform a plasma processing method described later.

Configuration of Plasma Etching Method According to Embodiment

Figure 2:
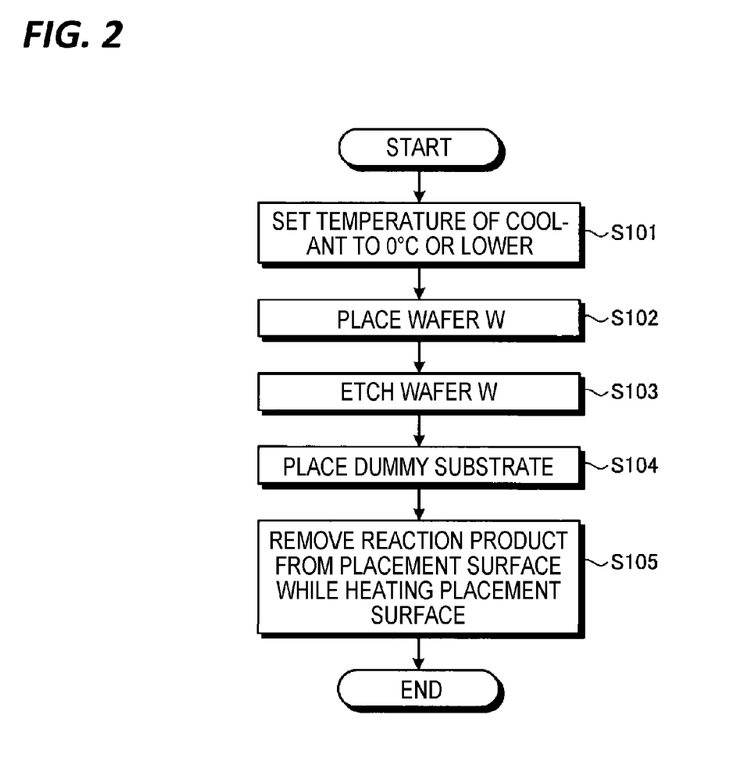
FIG. 2 is a flowchart illustrating an example of a flow of a plasma processing method using a plasma etching apparatus according to an embodiment.

FIG. 2 is a flowchart illustrating an example of a flow of a plasma processing method using a plasma etching apparatus 1 according to an embodiment.

As illustrated in FIG. 2, the controller 100 controls each unit of the plasma etching apparatus 1 to control the temperature of the coolant flowing through the coolant flow path 104a formed inside the placement table 20 to a temperature of 0° C. or lower (step S101). Specifically, the controller 100 controls the chiller 107 to cause the coolant of 0° C. or lower to flow through the coolant flow path 104a. The processing subsequent to step S101 is performed while allowing the coolant at 0° C. or lower to flow through the coolant flow path 104a. When a wafer W is loaded into the chamber 10, the controller 100 places the wafer W on the placement surface of the placement table 20 (step S102).

Subsequently, the controller 100 controls each unit of the plasma etching apparatus 1 to etch the wafer W placed on the placement surface of the placement table 20 (step S103). Specifically, the controller 100 controls the gas source 15 to supply a processing gas into the chamber 10, and controls the first radio-frequency power supply 32 to supply first radio-frequency power for plasma generation to the placement table 20. Thereby, the plasma of the processing gas is generated in the chamber 10, and the wafer W is etched by the plasma of the processing gas. At this time, the controller 100 may control the second radio-frequency power supply 34 to apply the second radio-frequency power for ion draw-in to the placement table 20. Step S103 is an example of a plasma processing step.

Figure 3:
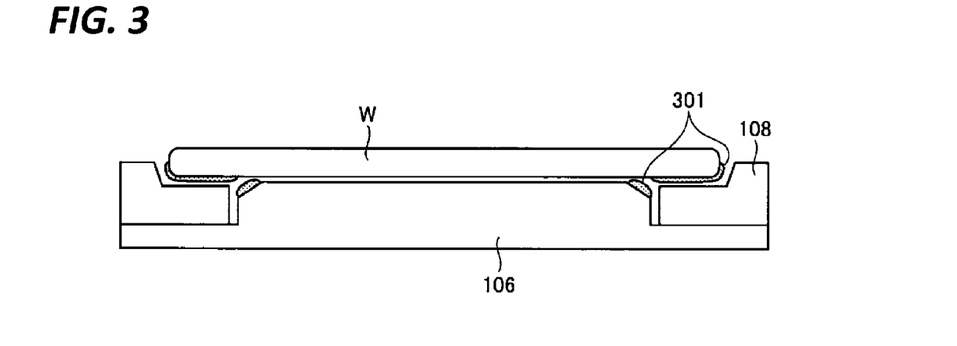
FIG. 3 is a view illustrating an example of a state of a wafer and the placement surface of a placement table after an etching step is performed.

The state of the wafer W and the placement surface of the placement table 20 after the etching is performed becomes the state illustrated in, for example, FIG. 3. FIG. 3 illustrates an example of the state of the wafer W and the placement surface of the placement table 20 after etching is performed. When the wafer W is etched, the reaction product 301 generated due to the etching of the wafer W adheres to the peripheral edge portion of the wafer W and the peripheral edge portion the placement surface of the placement table 20 (that is, the holding surface of the electrostatic chuck 106), as illustrated in FIG. 3. In FIG. 3, the peripheral edge portion of the placement surface of the placement table 20 corresponds to, for example, an inclined surface in which the distance to the wafer W increases in the radial direction of the wafer W. Therefore, when the reaction product 301 generated due to the etching is removed from the peripheral edge portion of the placement surface of the placement table 20 by the plasma of the processing gas, the first radio-frequency power for plasma generation applied to the placement table 20 is increased.

Descriptions will be made referring back to FIG. 2. Subsequently, the controller 100 controls each unit of the plasma etching apparatus 1 to replace the wafer W with a dummy substrate on the placement surface of the placement table 20 (step S104). As a result, the placement surface of the placement table 20 is covered with the dummy substrate.

Subsequently, the controller 100 controls each unit of the plasma etching apparatus 1 such that, in the state where the dummy substrate is placed on the placement surface of the placement table 20, the reaction product 301 generated due to the etching of the wafer W is removed from the peripheral edge portion of the placement surface by the plasma of the processing gas while the placement surface by the processing gas is heated via the dummy substrate (step S105).

Specifically, the controller 100 controls the gas source 15 to supply the processing gas into the chamber 10. The controller 100 may control the first radio-frequency power supply 32 to apply the first radio-frequency power for plasma generation to the placement table 20. Thus, the plasma of the processing gas is formed in the chamber 10, and the placement surface of the placement table 20 is heated by the plasma of the processing gas via the dummy substrate. As a result, the reaction product 301 is removed from the peripheral edge portion of the placement surface of the placement table 20 by the plasma of the processing gas flowing around the lower surface of the peripheral edge portion of the dummy substrate. At this time, since the placement surface of the placement table 20 is protected by the dummy substrate, even when the first-radio frequency power for plasma generation is increased, damage given to the placement surface of the placement table 20 is suppressed. Step S112 is an example of a removal step.

In addition, the controller 100 does not supply heat transfer gas between the placement surface of the placement table 20 and the lower surface of the dummy substrate during the heating of the placement surface of the placement table 20 in the removal step. Specifically, during the heating of the placement surface of the placement table 20 in the removal step, the controller 100 controls the heat transfer gas supply source 85 to stop the supply of the heat transfer gas to the rear surface of the dummy substrate. Thus, since the movement of heat from the dummy substrate to the placement table 20 is suppressed, the heating of the placement surface of the placement table 20 is promoted. As a result, the reaction product 301 is efficiently removed from the peripheral edge portion of the placement surface of the placement table 20 by the plasma of the processing gas.

Figure 4:
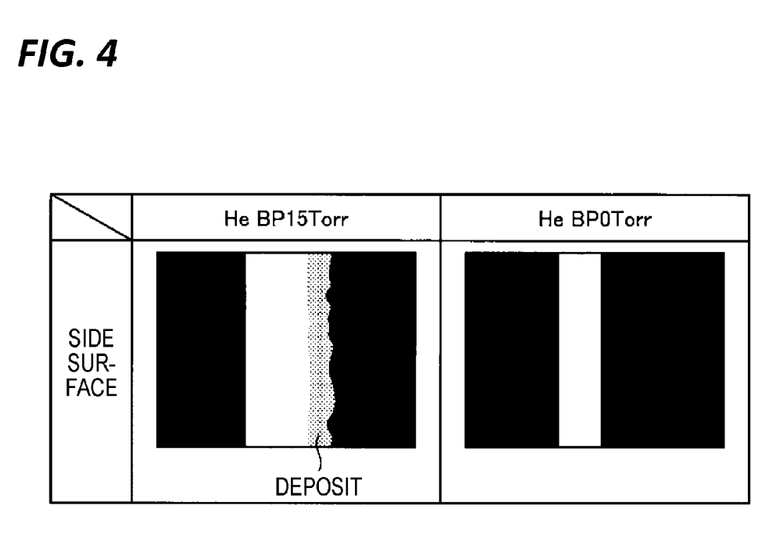
FIG. 4 is a view illustrating an example of a measurement result of reaction product removal performance according to the presence or absence of supply of a heat transfer gas.

FIG. 4 is a view illustrating an example of reaction product removal performance according to the presence or absence of supply of a heat transfer gas. In the measurement illustrated in FIG. 4, the removal step was performed using a measurement substrate. The reaction product (deposit) generated by etching of the wafer W adhered to the peripheral edge portion of the measurement substrate. By observing the peripheral edge portion of the measurement substrate after the removal step was performed from the side thereof and determining the presence or absence of the deposit at the peripheral edge portion of the measurement substrate, it was determined whether or not the reaction product 301 was removed from the peripheral edge portion of the placement surface of the placement table 20. However, in the example, heat transfer gas was not supplied between the placement surface of the placement table 20 and the lower surface of the measurement substrate during the heating of the placement surface of the placement table 20 in the removal step. In contrast, in a reference example, during the heating of the placement surface of the placement table 20 in the removal step, the heat transfer gas was supplied between the placement surface of the placement table 20 and the lower surface of the measurement substrate such that the pressure of the heat transfer gas becomes 15 Torr. In the reference examples and the example, as other conditions, for example, the following conditions were used: the internal pressure of the chamber 10: 400 mTorr, the first radio-frequency power: 5500 W, the second radio-frequency power: 500 W, the processing gas and the flow rate ratio: $CF_4/O_2=17/283$ (flow rate ratio), and the temperature of the coolant: −30° C. or lower. In addition, the second radio-frequency power may be or may not be applied.

In FIG. 4, "He BP15Torr" represents the state of the peripheral edge portion of a measurement substrate after the removal step in the reference example was performed, "He BP0Torr" represents the state of the peripheral portion of a measurement substrate after the removal step in the example was performed.

As represented in FIG. 4, in the reference example, deposit remained on the peripheral edge portion of the measurement substrate. In contrast, in the example, deposit was removed from the peripheral edge portion of the measurement substrate. That is, by not supplying the heat transfer gas between the placement surface of the placement table 20 and the lower surface of the dummy substrate during the heating of the placement surface of the placement table 20 in the removal step, it was found that the reaction product 301 was efficiently removed from the peripheral edge portion of the placement surface of the placement table 20.

Descriptions return to a description of the removal step. In the removal step, the pressure inside the chamber 10 is maintained at a predetermined pressure that causes the plasma of the processing gas to flow around the peripheral edge portion of the lower surface of the dummy substrate. For example, in the removal step, the pressure inside the chamber 10 is maintained at a pressure of 400 mTorr or higher. As a result, the density of the plasma of the processing gas that flows around the lower surface of the peripheral edge portion of the dummy substrate and reaches the peripheral edge portion of the placement surface of the placement table 20 is increased. As a result, the reaction product 301 is efficiently removed from the peripheral edge portion of the placement surface of the placement table 20 by the plasma of the processing gas.

Figure 5:
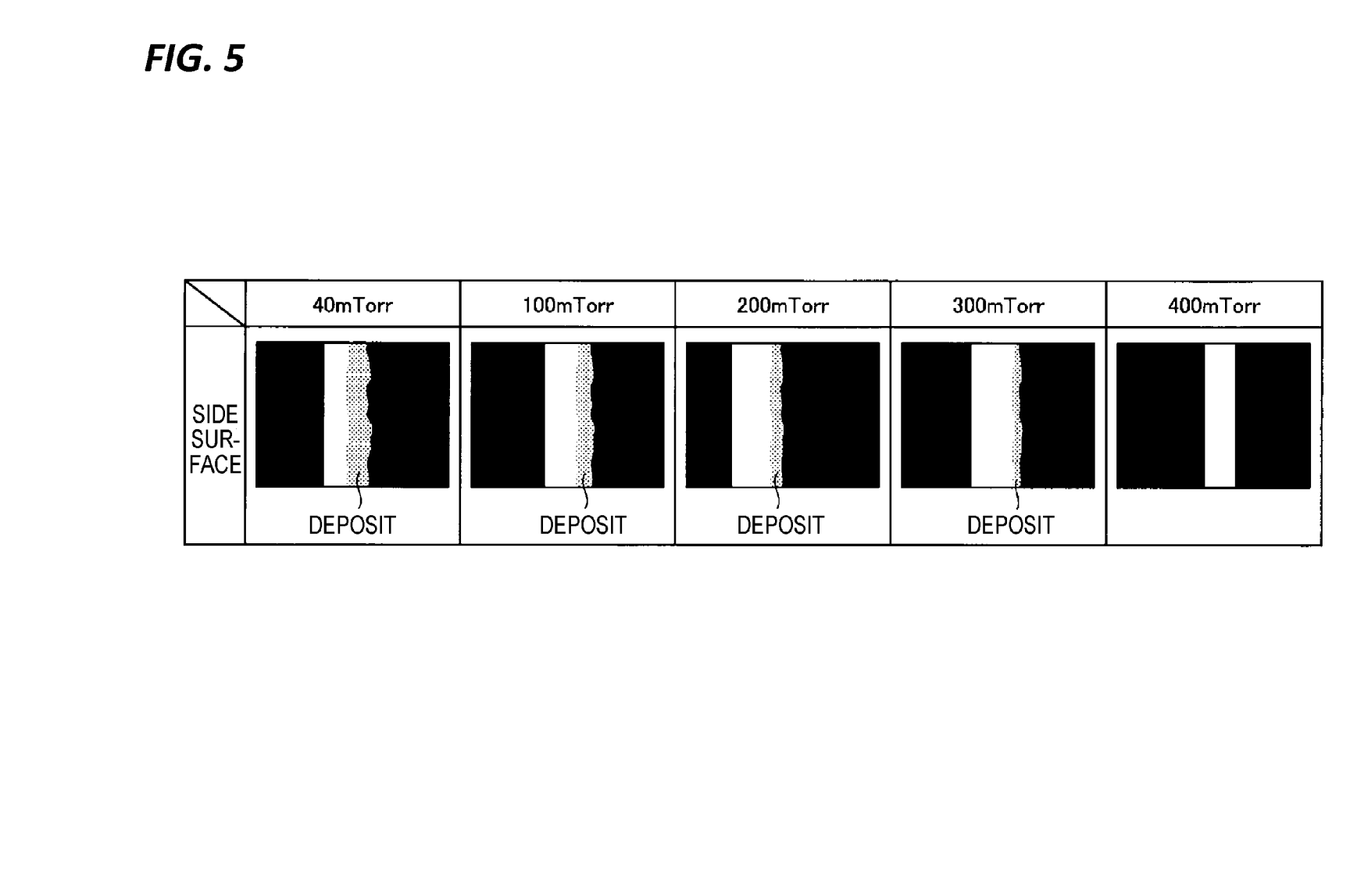
FIG. 5 is a view illustrating an example of a measurement result of reaction product removal performance according to a pressure.

FIG. 5 is a view illustrating an example of reaction product removal performance according to a pressure. In the measurement illustrated in FIG. 5, a measurement substrate was provided, and the removal step was performed using the measurement substrate. The reaction product (deposit) generated by etching of the wafer W adhered to the peripheral edge portion of the measurement substrate. By observing the peripheral edge portion of the measurement substrate after the removal step was performed from the side thereof and determining the presence or absence of the deposit at the peripheral edge portion of the measurement substrate, it was determined whether or not the reaction product 301 was removed from the peripheral edge portion of the placement surface of the placement table 20. However, in Example 1, the pressure inside the chamber 10 was maintained at 400 mTorr when the removal step was executed. In contrast, in Reference Example 1, the pressure inside the chamber 10 was maintained at 40 mTorr when the removal step was performed. In Reference Example 2, the pressure inside the chamber 10 was maintained at 100 mTorr when the removal step was executed. In Reference Example 3, the pressure inside the chamber 10 was maintained at 200 mTorr when the removal step was executed. In Reference Example 4, the pressure inside the chamber 10 was maintained at 300 mTorr when the removal step was executed. In Reference Examples 1 to 4 and Example 1, as other conditions, the following conditions were used: the first radio-frequency power: 5500 W, the second radio-frequency power: 500 W, the processing gas and the flow rate ratio: $CF_4/O_2=17/283$ (flow rate ratio), the temperature of coolant: −37° C., and the heat transfer gas: not supplied.

In FIG. 5, "40 mTorr," "100 mTorr," "200 mTorr," and "300 mTorr" indicate the state of the peripheral edge portions of measurement substrates after the removal steps in Reference Examples 1 to 4 were respectively performed thereon. In contrast, "400 mTorr" indicate the state of the peripheral edge portion of a measurement substrate after the removal step in Example 1 was executed.

As represented in FIG. 5, in Reference Examples 1 to 4 in which the pressure inside the chamber 10 was maintained at less than 400 mTorr, deposit remained on the peripheral edge portions of the measurement substrates. In contrast, in Example 1 in which the internal pressure of the chamber 10 was maintained at 400 mTorr, deposit was removed from the peripheral edge portion of the measurement substrate. That is, it was found that the reaction product 301 is efficiently removed from the peripheral edge portion of the placement surface of the placement table 20 by maintaining the pressure inside the chamber 10 at 400 mTorr in the removal step.

Descriptions return to a description of the removal step. The processing gas used in the removal step is a mixed gas containing a fluorine-containing gas and an oxygen-containing gas. The fluorine-containing gas contains at least one of fluorine-containing gases such as, for example, $CF_4$, $NF_3$, and $C_4F_8$, which contain fluorine in constituent elements. The oxygen-containing gas contains at least one of, for example, $O_2$, $O_3$, CO, $CO_2$, and COS. Here, the reaction product generated due to etching contains a carbon (C) component, a fluorine (F) component, and a silicon (Si) component. The oxygen-containing gas contained in the mixed gas has functions of reacting with the C component and the F component contained in the reaction product, and removing the C component and the F component. The fluorine-containing gas contained in the mixed gas has functions of reacting with the Si component contained in the reaction product, and removing the Si component.

Figure 6:
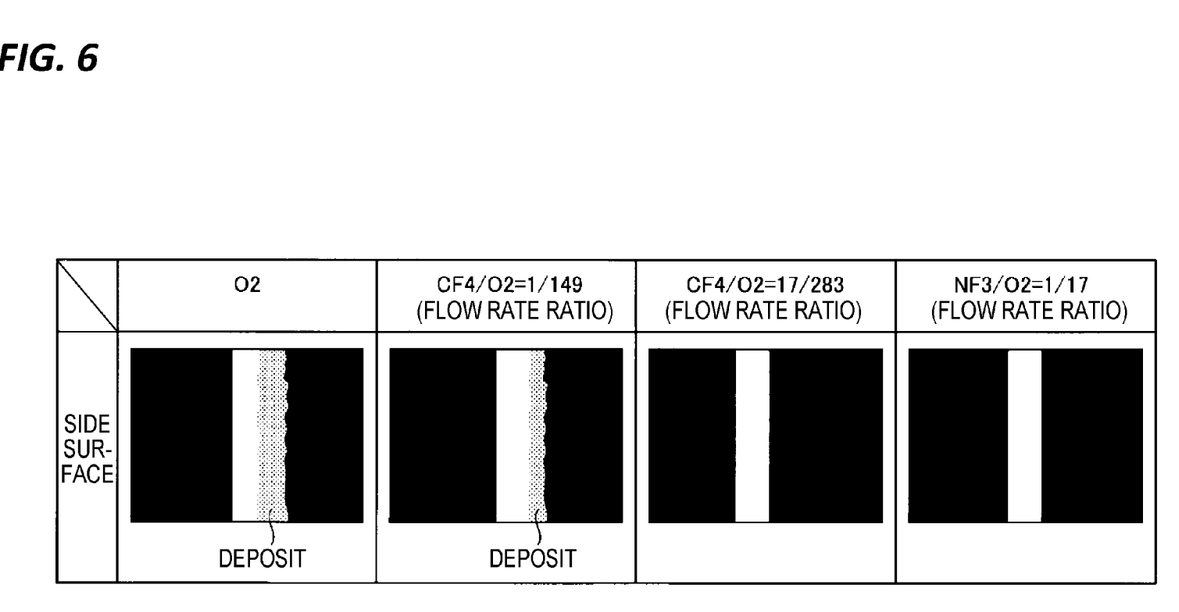
FIG. 6 is a view illustrating an example of a measurement result of reaction product removal performance according to a kind of processing gas.

FIG. 6 is a view illustrating an example of reaction product removal performance according to the kind of processing gas. In the measurement illustrated in FIG. 6, a measurement substrate was provided, and the removal step was performed using the measurement substrate. The reaction product (deposit) generated by etching of the wafer W adhered to the peripheral edge portion of the measurement substrate. Then, by observing the peripheral edge portion of the measurement substrate after the removal step was performed from the side thereof and determining the presence or absence of the deposit at the peripheral edge portion of the measurement substrate, it was determined whether or not the reaction product 301 was removed from the peripheral edge portion of the placement surface of the placement table 20. However, in Example 1, the removal step was performed using $CF_4/O_2=1/149$ (flow rate ratio) as the processing gas and flow rate ratio. In Example 2, the removal step was performed using $CF_4/O_2=17/283$ (flow rate ratio) as the processing gas and flow rate ratio. In Example 3, the removal step was performed using $NF_3/O_2=1/17$ (flow rate ratio) as the processing gas and flow rate ratio. In contrast, in Reference Example 1, the removal step was performed using $O_2$ as a processing gas. In Reference Example 1 and Examples 1 to 3, as other conditions, the following conditions were used: the pressure inside the chamber 10: 400 mTorr, the first radio-frequency power: 5,500 W, the second radio-frequency power: 500 W, the temperature of the coolant: −30° C. or lower, and heat transfer gas: not supplied.

In FIG. 6, "$O_2$" indicates the state of the peripheral portion of the measurement substrate after the removal step in Reference Example 1 was executed. On the other hand, "$CF_4/O_2=1/149$ (flow rate ratio)," "$CF_4/O_2=17/283$ (flow rate ratio)," and "$NF_3/O_2=1/17$ (flow rate ratio)" represent the states of the peripheral edge portions of the measurement substrates after the removal steps in Examples 1 to 3 were performed.

As represented in FIG. 6, when using $O_2$, deposit remained on the peripheral edge portions of the measurement substrates. In contrast, when using $CF_4/O_2=1/149$ (flow rate ratio), the amount of deposit remaining on the peripheral edge portion of the measurement substrate decreased compared with the case of using $O_2=1,500$ sccm. Furthermore, when using $CF_4/O_2=17/283$ (flow rate ratio) and $NF_3/O_2=1/17$ (flow rate ratio), the deposit was removed from the peripheral edge portions of the measurement substrates. That is, in the removal step, it has been found that the reaction product 301 is efficiently removed from the peripheral edge portion of the placement surface of the placement table 20 using a mixed gas containing a fluorine-containing gas and an oxygen-containing gas as the processing gas.

Descriptions return to a description of the removal step. In the removal step, the controller 100 removes the reaction product 301 from the peripheral edge portion of the placement surface of the placement table 20, and also removes the reaction product 301 from members other than the placement table 20 disposed in the chamber 10. That is, since the reaction product 301 also adheres to members other than the placement table 20, the controller 100 simultaneously removes the reaction product 301 from the peripheral edge portion of the placement surface of the placement table 20 and from members other than the placement table 20. The members other than the placement table 20 are, for example, the side wall of the chamber 10 and the gas shower head 25.

As described above, according to an embodiment, a substrate placed on the placement surface of the placement table 20 is etched, and, in the state where a dummy substrate is placed on the placement surface of the placement table in place of the substrate, the reaction product generated due to etching is removed from the peripheral edge portion of the placement surface while the placement surface is heated by plasma. At this time, since the placement surface of the placement table 20 is protected by the dummy substrate, even when the radio-frequency power for plasma generation is increased, damage given to the placement surface of the placement table 20 is suppressed. As a result, it is possible to appropriately remove the reaction product generated due to the etching from the peripheral edge portion of the placement surface of the placement table 20 without damaging the placement surface of the placement table 20.

Other Embodiments

Although the plasma etching apparatus and the plasma processing method according to an embodiment have been described above, the present disclosure is not limited thereto. Other embodiments will be described below.

Heating of Placement Surface of Placement Table

In the above embodiment, an example is illustrated in which the heat transfer gas is not supplied between the placement surface of the placement table 20 and the lower surface of the dummy substrate during the heating of the placement surface of the placement table 20 in the removal step. However, the structure for promoting the heating of the placement surface of the placement table 20 is not limited thereto. Below, Modifications 1 to 5 of the structures of the placement table 20 and the chiller 107 configured to promote the heating of the placement surface of the placement table 20 will be described.

Figure 7:
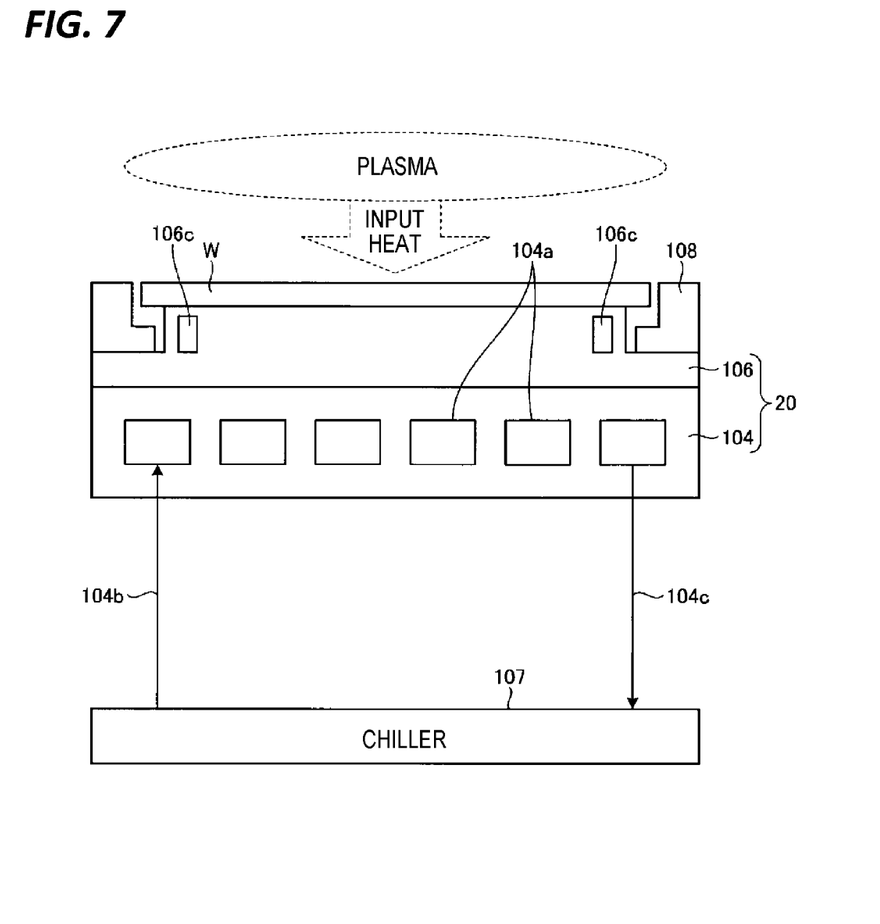
FIG. 7 is a view illustrates Modification 1 of the structure of a placement table and a chiller according to an embodiment.

FIG. 7 is a view illustrating Modification 1 of the structure of a placement table 20 and a chiller 107 according to an embodiment. In Modification 1, a heater 106c is disposed in a region corresponding to the peripheral edge portion of the placement surface (the holding surface of the electrostatic chuck 106) inside the placement table 20 (electrostatic chuck 106).

In Modification 1, the controller 100 locally heats the peripheral edge portion of the placement surface by the heater 106c during the heating of the placement surface of the placement table 20 in the removal step. Thus, the placement surface of the placement table 20 is entirely heated by heat input from the plasma, and the heating of the peripheral edge portion of the placement surface of the placement table 20 is locally promoted by the heat input from the heater 106c. As a result, the reaction product may be efficiently removed from the peripheral edge portion of the placement surface of the placement table 20 by plasma.

Figure 8:
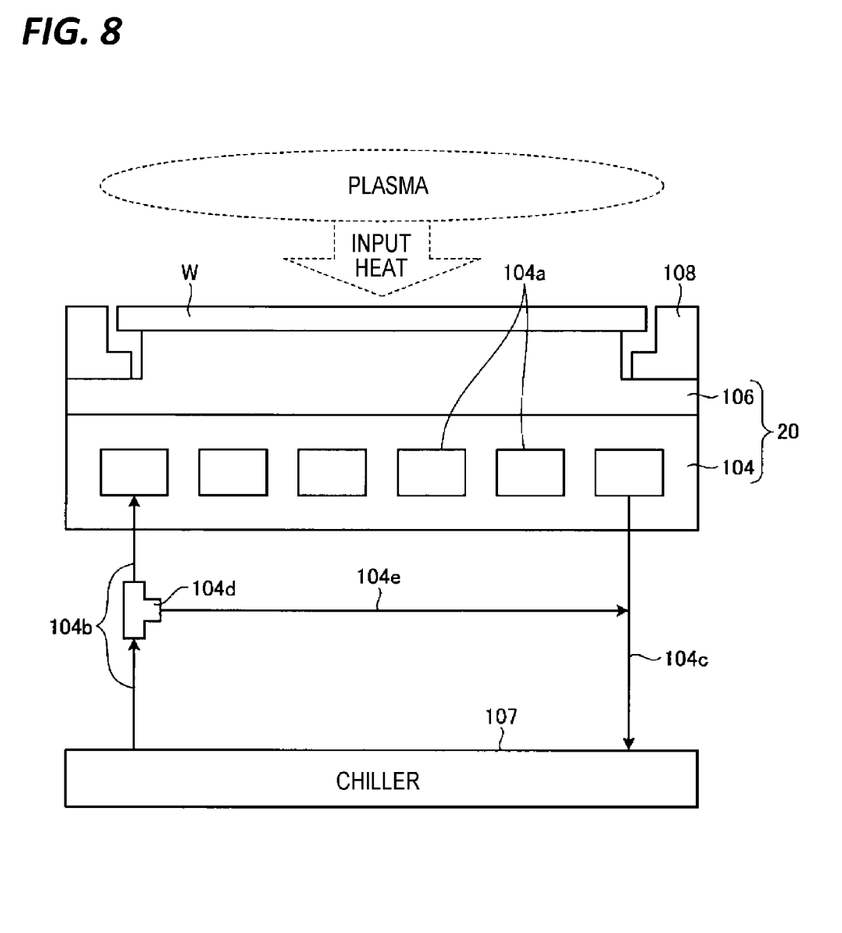
FIG. 8 is a view illustrates Modification 2 of the structure of a placement table and a chiller according to an embodiment.

FIG. 8 is a view illustrating Modification 2 of the structure of the placement table 20 and the chiller 107 according to an embodiment. In Modification 2, a coolant inlet pipe 104b having a three-way valve 104d is connected to a coolant flow path 104a formed inside the placement table 20 (base 104). Further, the three-way valve 104d is connected to a coolant outlet pipe 104c via a bypass pipe 104e.

In Modification 2, the controller 100 decreases the flow rate of the coolant flowing through the coolant flow path 104a during the heating of the placement surface of the placement table 20 in the removal step. Specifically, when the etching step is executed, the controller 100 closes a connection portion between the three-way valve 104d and the bypass pipe 104e. In this case, the coolant output from the chiller 107 is supplied to the coolant flow path 104a via the coolant inlet pipe 104b, and the coolant flowing through the coolant flow path 104a returns to the chiller 107 via the coolant outlet pipe 104c. As a result, when the etching step is executed, all the coolant output from the chiller 107 circulates through the inside of the placement table 20 (the base 104), and the flow rate of the coolant flowing through the coolant flow path 104a becomes equal to the flow rate of the coolant output from the chiller 107.

Meanwhile, when the removal step is executed, the controller 100 closes a connection portion between the three-way valve 104d and the bypass pipe 104e. In this case, the coolant output from the chiller 107 is branched into the coolant inlet pipe 104b and the bypass pipe 104e by the three-way valve 104d. The coolant branched into the coolant inlet pipe 104b is supplied to the coolant flow path 104a, and the coolant flowing through the coolant flow path 104a merges with the coolant branched into the bypass pipe 104e at the coolant outlet pipe 104c and then return to the chiller 107. As a result, when the removal step is executed, since a part of the coolant output from the chiller 107 is branched to the bypass pipe 104e, the flow rate of the coolant flowing through the coolant flow path 104a is decreased, compared with the flow rate of the coolant output from the chiller 107.

In the example illustrated in FIG. 8, while the flow rate of the coolant flowing through the coolant flow path 104a is decreased during the heating of the placement surface of the placement table 20 in the removal step, the supply of the coolant to the coolant flow path 104a may be stopped during the heating of the placement surface of the placement table 20 in the removal step. In this case, when the removal step is executed, the controller 100 closes the outlet on the coolant flow path 104a side of the three-way valve 104d and opens the connection portion between the three-way valve 104d and the bypass pipe 104e. As a result, all the coolant output from the chiller 107 is supplied to the bypass pipe 104e, and the supply of the coolant to the coolant flow path 104a is stopped.

As described above, during the heating of the placement surface of the placement table 20 in the removal step, heat removal from the placement surface of the placement table 20 is suppressed and heating of the placement surface is promoted by decreasing the flow rate of the coolant flowing through the coolant flow path 104a or by stopping the supply of the coolant to the coolant flow path 104a. For this reason, the reaction product may be efficiently removed from the peripheral edge portion of the placement surface of the placement table 20 by plasma.

Figure 9:
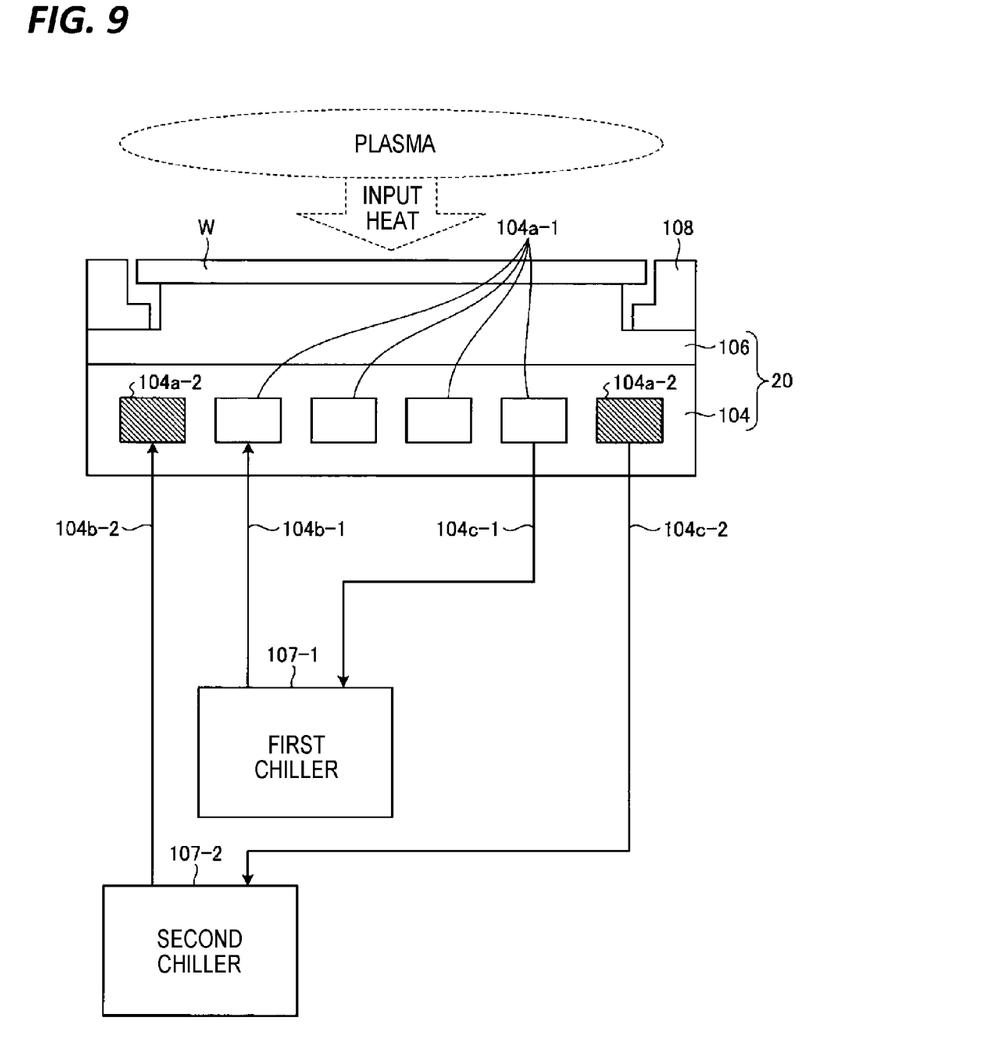
FIG. 9 is a view illustrates Modification 3 of the structure of a placement table and a chiller according to an embodiment.

FIG. 9 is a view illustrating Modification 3 of the structure of a placement table 20 and a chiller 107 according to an embodiment. In Modification 3, the coolant flow path 104a formed inside the placement table 20 (the base 104) has a first coolant flow path 104a-1 and a second coolant flow path 104a-2. The first coolant flow path 104a-1 and the second coolant flow path 104a-2 are formed independently from each other inside the base 104. Specifically, the first coolant flow path 104a-1 is formed in a spiral shape in a region corresponding to the center portion of the placement surface inside the base 104 (that is, the holding surface of the electrostatic chuck 106). A coolant inlet pipe 104b-1 and a coolant outlet pipe 104c-1 are connected to the first coolant flow path 104a-1. In addition, the second coolant flow path 104a-2 is formed in a spiral shape in a region corresponding to the peripheral edge portion of the placement surface inside the base 104 (that is, the holding surface of the electrostatic chuck 106). A coolant inlet pipe 104b-2 and a coolant outlet pipe 104c-2 are connected to the second coolant flow path 104a-2.

The chiller 107 has a first chiller 107-1 and a second chiller 107-2. The coolant output from the first chiller 107-1 circulates through the coolant inlet pipe 104b-1, the first coolant flow path 104a-1, and the coolant outlet pipe 104c-1. The coolant output from the second chiller 107-2 circulates through the coolant inlet pipe 104b-2, the second coolant flow path 104a-2, and the coolant outlet pipe 104c-2.

In Modification 3, the controller 100 decreases the flow rate of the coolant flowing through the second coolant flow path 104a-2 during the heating of the placement surface of the placement table 20 in the removal step. Specifically, when the etching step is executed, the controller 100 makes the flow rate of the coolant output from the first chiller 107-1 and the flow rate of the coolant output from the second chiller 107-2 coincident with each other. As a result, the flow rate of the coolant flowing through the second coolant flow path 104a-2 becomes equal to the flow rate of the coolant flowing through the first coolant flow path 104a-1.

Specifically, when the etching step is executed, the controller 100 decreases the flow rate of the coolant output from the second chiller 107-2 while maintaining the flow rate of the coolant output from the first chiller 107-2. As a result, the flow rate of the coolant flowing through the second coolant flow path 104a-2 is decreased compared with the flow rate of the coolant flowing through the first coolant flow path 104a-1.

In Modification 3, while the flow rate of the coolant flowing through the second coolant flow path 104a-2 is decreased during the heating of the placement surface of the placement table 20 in the removal step, the supply of the coolant to the second coolant flow path 104a-2 may be stopped during the heating of the placement surface of the placement table 20 in the removal step. In this case, the controller 100 stops the output of the coolant from the second chiller 107-2 when the removal step is executed. As a result, the supply of the coolant to the second coolant flow path 104a-2 is stopped.

As described above, during the heating of the placement surface of the placement table 20 in the removal step, the heating of the peripheral edge of the placement surface of the placement table 20 is promoted by decreasing the flow rate of the coolant flowing through the second coolant flow path 104a-2 or by stopping the supply of the coolant to the second coolant flow path 104a-2. For this reason, the reaction product may be efficiently removed from the peripheral edge portion of the placement surface of the placement table 20 by plasma.

Figure 10:
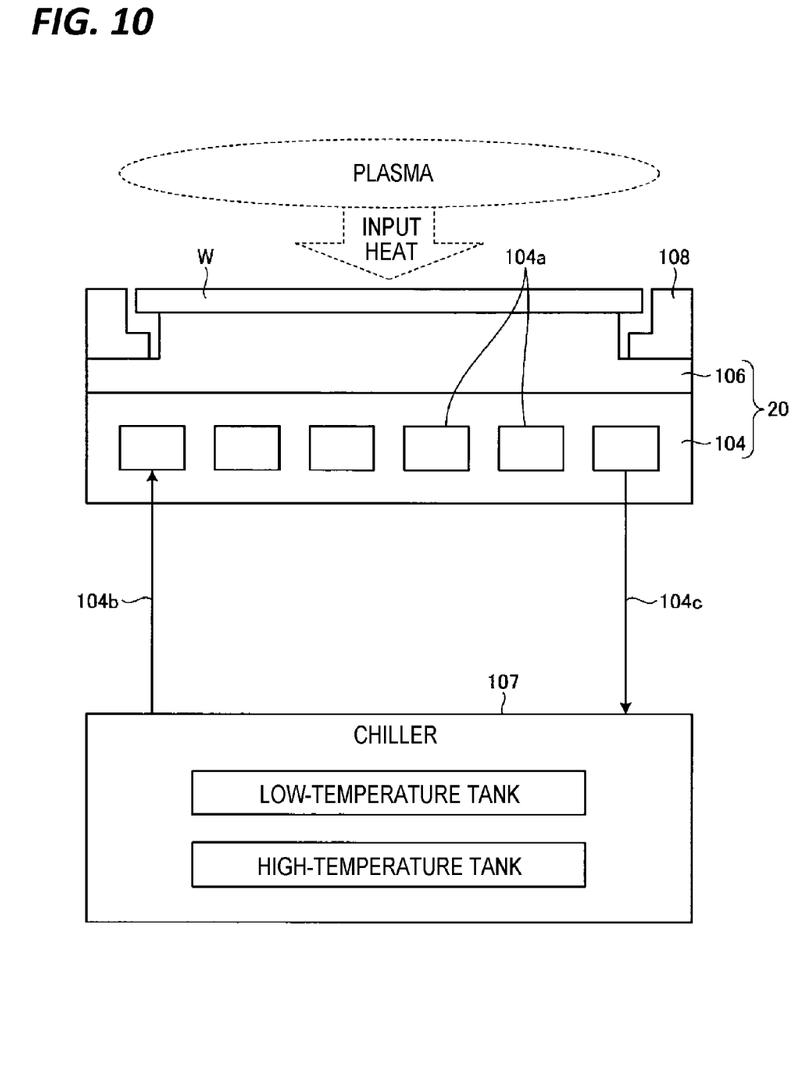
FIG. 10 is a view illustrates Modification 4 of the structure of a placement table and a chiller according to an embodiment.

FIG. 10 is a view illustrating Modification 4 of the structure of the placement table 20 and the chiller 107 according to an embodiment. In Modification 4, the chiller 107 includes a low-temperature tank configured to store therein the coolant of which the temperature is adjusted to the first temperature used for etching the wafer W, and a high-temperature tank configured to store therein the coolant of which the temperature is adjusted to a second temperature higher than the first temperature. The low-temperature tank stores, for example, the coolant at −70° C. therein, and the high-temperature tank stores, for example, the coolant at 25° C. therein.

In Modification 4, during the heating of the placement surface of the placement table 20 in the removal step, the controller 100 raises the temperature of the coolant flowing through the coolant flow path 104a to the second temperature higher than the first temperature used for etching the wafer W. Specifically, when the etching step is executed, the controller 100 supplies the coolant of the first temperature stored in the low-temperature tank of the chiller 107 to the coolant flow path 104a to flow through the coolant flow path 104a. Meanwhile, when the removal step is executed, the controller 100 supplies the coolant of the second temperature stored in the high-temperature tank of the chiller 107 to the coolant flow path 104a to flow through the coolant flow path 104a. As a result, during the heating of the placement surface of the placement table 20 in the removal step, the temperature of the coolant flowing through the coolant passage 104a rises from the first temperature to the second temperature.

In this way, during the heating of the placement surface of the placement table 20 in the removal step, by raising the temperature of the coolant flowing through the coolant flow path 104a to the second temperature higher than the first temperature used for etching the wafer W, the heating of the placement surface is promoted. For this reason, the reaction product may be efficiently removed from the peripheral edge portion of the placement surface of the placement table 20 by plasma.

Figure 11:
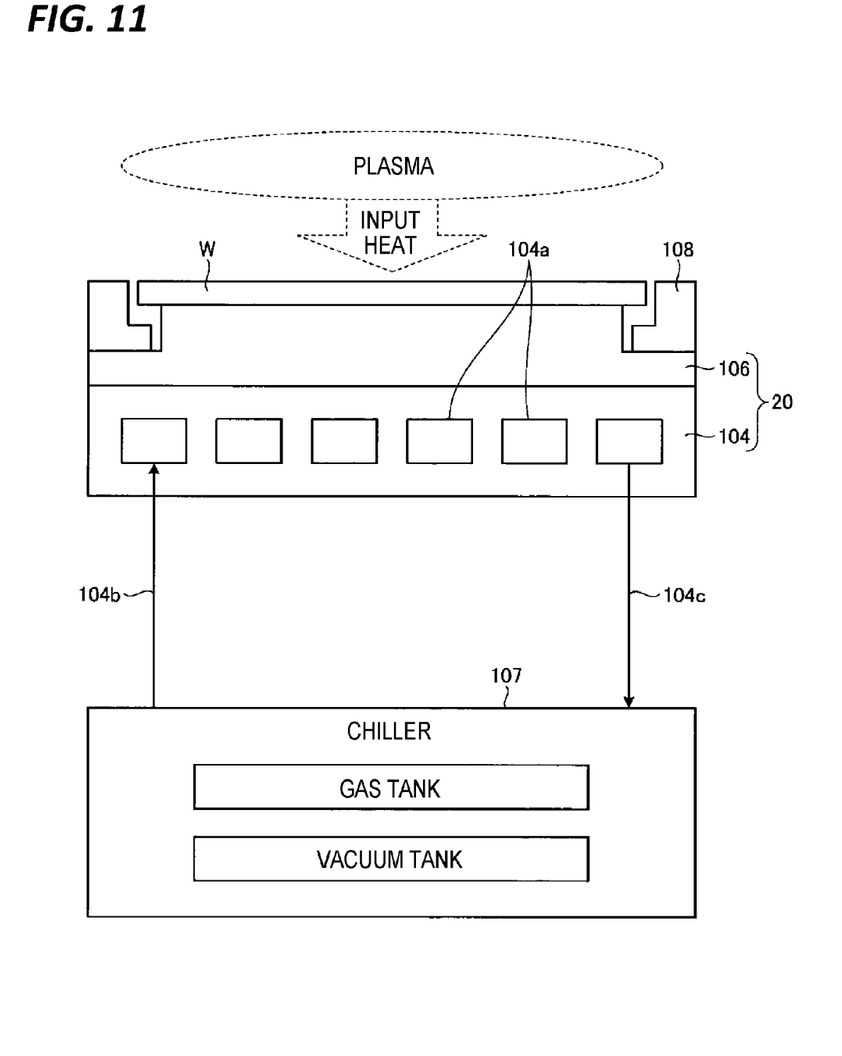
FIG. 11 is a view illustrates Modification 5 of the structure of a placement table and a chiller according to an embodiment.

FIG. 11 is a view illustrating Modification 5 of the structure of the placement table 20 and the chiller 107 according to an embodiment. In Modification 5, a gas is used as the coolant. The gas used as a coolant (hereinafter, referred to as "coolant gas") is, for example, fluorocarbon gas. The chiller 107 has a gas tank configured to store a coolant gas of which the temperature is adjusted to 0° C. or lower, and a vacuum pump connected to the coolant inlet pipe 104*b* and the coolant outlet pipe 104*c*.

In Modification 5, the controller 100 sucks the coolant gas from the coolant flow path 104*a* during the heating of the placement surface of the placement table 20 in the removal step. Specifically, when the etching step is executed, the controller 100 supplies the coolant gas stored in the gas tank of the chiller 107 to the coolant flow path 104*a* to flow through the coolant flow path 104*a*. Meanwhile, when the removal step is executed, the controller 100 controls the vacuum pump to suck the coolant gas from the coolant flow path 104*a* via the coolant inlet pipe 104*b* and the coolant outlet pipe 104*c*.

In this way, by sucking the coolant gas from the coolant flow path 104*a* during the heating of the placement surface of the placement table 20 in the removal step, heat removal from the placement surface is suppressed, and the heating of the placement surface is promoted. For this reason, the reaction product may be efficiently removed from the peripheral edge portion of the placement surface of the placement table 20 by plasma.

In addition, in the above description, individual configurations and operations have been described for each embodiment and each modification. However, the placement table 20 and the chiller 107 according to the embodiment and each of the modifications may have structural elements peculiar to other modifications. In addition, the combination of each embodiment and each modification is not limited to two, and any form such as, for example, a combination of three or more may be adopted. For example, even when the plasma etching apparatus 1 according to the above embodiment may include both the heater 106*c* of the placement table 20 according to Modification 1 and the three-way valve 10*d* and the bypass pipe 104*e* of the placement table 20 according to Modification 2. Furthermore, one plasma etching apparatus 1 may have all the components described in the above embodiment and Modifications 1 to 5 within a compatible range.

In addition, in the above-described embodiment, the case where the plasma etching is performed on a wafer W has been described as an example of the plasma processing, but the disclosed technique is applicable to other plasma processings. The other plasma processings may include, for example, plasma chemical vapor deposition (CVD).

Furthermore, the substrate processing apparatus according to the present disclosure is applicable not only to a capacitively coupled plasma (CCP) apparatus, but also to other substrate processing apparatuses. Other substrate processing apparatuses may be, for example, an inductively coupled plasma (ICP) apparatus, a plasma processing apparatus using a radial line slot antenna, a helicon wave plasma (HWP) apparatus, and an electron cyclotron resonance (ECR) plasma apparatus.

In the above description, a case where the substrate to be etched is a semiconductor wafer has been described as an example, but the substrate may be any of various substrates used in, for example, a liquid crystal display (LCD) or a flat panel display (FPD), a photomask, a CD substrate, and a printed circuit board.

According to an aspect of the plasma processing method disclosed herein, it is possible to appropriately remove a reaction product generated due to a plasma processing of a substrate from the peripheral portion of the placement surface of a placement table.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   plasma-processing a substrate placed on a surface of a placement table while causing a coolant of 0° C. or lower to flow through a coolant flow path formed inside the placement table;
   placing a dummy substrate on the surface of the placement table in place of the substrate; and
   removing a reaction product generated due to the plasma processing of the substrate by plasma of a processing gas from a peripheral edge portion of the surface of the placement table while heating the surface of the placement table by the plasma of the processing gas via the dummy substrate in a state where the dummy substrate is placed on the surface of the placement table.

2. The plasma processing method of claim 1, wherein, in the removing the reaction product, the peripheral edge portion of the surface of the placement table is heated by a heater disposed in a region corresponding to the peripheral edge portion of the surface of the placement table inside the placement table during the heating of the surface of the placement table.

3. The plasma processing method of claim 1, wherein, in the removing the reaction product, a temperature of the coolant flowing through the coolant flow path is raised to a temperature higher than a temperature used for the plasma processing of the substrate.

4. The plasma processing method of claim 1, wherein a gas is used as the coolant, and
   in the removing the reaction product, the gas is sucked from the coolant flow path during the heating of the surface of the placement table.

5. The plasma processing method of claim 1, wherein, in the removing the reaction product, the reaction product generated due to the plasma processing of the substrate is removed from the peripheral edge portion of the surface of the placement table, and the reaction product is removed from a member, which is disposed in a chamber, other than the placement table.

6. The plasma processing method of claim 1, wherein, in the removing the reaction product, a pressure inside a chamber is maintained at a predetermined pressure that causes the plasma of the processing gas to flow around a peripheral edge portion of a lower surface of the dummy substrate.

7. The plasma processing method of claim 1, wherein the processing gas is a mixed gas containing a fluorine-containing gas and an oxygen-containing gas.

8. The plasma processing method of claim 1, wherein, in the removing the reaction product, a flow rate of the coolant flowing through the coolant flow path is decreased or supply of the coolant to the coolant flow path is stopped during the heating of the surface of the placement table.

9. The plasma processing method of claim 8, wherein the coolant flow path includes a first coolant flow path formed in a region corresponding to a center portion of the surface of the placement table inside the placement table and a second coolant flow path formed in a region corresponding to a peripheral edge portion of the surface of the placement table inside the placement table, and
   in the removing the reaction product, the flow rate of the coolant flowing through the second coolant flow path is decreased or the supply of the coolant to the second coolant flow path is stopped during the heating of the surface of the placement table.

10. The plasma processing method of claim 1, wherein, in the removing the reaction product, a heat transfer gas is not supplied between the surface of the placement table and a lower surface of the dummy substrate during the heating of the surface of the placement table.

11. The plasma processing method of claim 10, wherein, in the removing the reaction product, the peripheral edge portion of the placement surface is heated by a heater disposed in a region corresponding to the peripheral edge portion of the surface of the placement table inside the placement table during the heating of the surface of the placement table.

12. The plasma processing method of claim 11, wherein, in the removing the reaction product, a flow rate of the coolant flowing through the coolant flow path is decreased or supply of the coolant to the coolant flow path is stopped during the heating of the surface of the placement table.

13. The plasma processing method of claim 12, wherein the coolant flow path includes a first coolant flow path formed in a region corresponding to a center portion of the surface of the placement table inside the placement table and a second coolant flow path formed in a region corresponding to a peripheral edge portion of the surface of the placement table inside the placement table, and
in the removing the reaction product, the flow rate of the coolant flowing through the second coolant flow path is decreased or the supply of the coolant to the second coolant flow path is stopped during the heating of the surface of the placement table.

14. The plasma processing method of claim 13, wherein, in the removing the reaction product, a temperature of the coolant flowing through the coolant flow path is raised to a temperature higher than a temperature used for the plasma processing of the substrate.

15. The plasma processing method of claim 14, wherein a gas is used as the coolant, and
in the removing the reaction product, the gas is sucked from the coolant flow path during the heating of the surface of the placement table.

16. The plasma processing method of claim 15, wherein, in the removing the reaction product, the reaction product generated due to the plasma processing of the substrate is removed from the peripheral edge portion of the surface of the placement table, and the reaction product is removed from a member, which is disposed in a chamber, other than the placement table.

17. The plasma processing method of claim 16, wherein, in the removing the reaction product, a pressure inside a chamber is maintained at a predetermined pressure that causes the plasma of the processing gas to flow around a peripheral edge portion of a lower surface of the dummy substrate.

18. The plasma processing method of claim 17, wherein the processing gas is a mixed gas containing a fluorine-containing gas and an oxygen-containing gas.

19. A plasma processing method comprising:
plasma-processing a substrate placed on a surface of a placement table of which a temperature is adjusted;
placing a dummy substrate on the surface of the placement table in place of the substrate; and
removing a reaction product generated due to the plasma processing of the substrate by plasma of a processing gas from a peripheral edge portion of the surface of the placement table while heating the surface of the placement table by the plasma of the processing gas via the dummy substrate in a state where the dummy substrate is placed on the surface of the placement table.

20. A plasma processing apparatus comprising:
a chamber configured to provide a processing space;
a placement table provided inside the chamber and configured to place a substrate thereon;
a gas supply source configured to supply a processing gas into the chamber; and
a controller configured to plasma-process a substrate placed on a surface of a placement table while causing a coolant of 0° C. or lower to flow through a coolant flow path formed inside the placement table; place a dummy substrate on the surface of the placement table in place of the substrate; and remove a reaction product generated due to the plasma processing of the substrate by plasma of the processing gas from a peripheral edge portion of the surface of the placement table while heating the surface of the placement table by the plasma of the processing gas via the dummy substrate in a state where the dummy substrate is placed on the surface of the placement table.

* * * * *